US010026740B1

(12) United States Patent
Zang et al.

(10) Patent No.: US 10,026,740 B1
(45) Date of Patent: Jul. 17, 2018

(54) DRAM STRUCTURE WITH A SINGLE DIFFUSION BREAK

(71) Applicant: GLOBALFOUNDRIES Inc., Grand Cayman (KY)

(72) Inventors: Hui Zang, Guilderland, NY (US); Jerome Ciavatti, Mechanicville, NY (US); Josef Watts, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/797,533

(22) Filed: Oct. 30, 2017

(51) Int. Cl.
*H01L 27/108* (2006.01)
*H01L 29/06* (2006.01)

(52) U.S. Cl.
CPC .... *H01L 27/10805* (2013.01); *H01L 29/0649* (2013.01); *H01L 27/10847* (2013.01)

(58) Field of Classification Search
CPC ......... H01L 27/10805; H01L 27/10823; H01L 27/10847
See application file for complete search history.

(56) References Cited

U.S. PATENT DOCUMENTS

| 5,357,464 | A | 10/1994 | Shukuri et al. |
| 6,211,544 | B1 | 4/2001 | Park et al. |
| 6,429,068 | B1 | 8/2002 | Divakaruni et al. |
| 6,913,964 | B2 | 7/2005 | Hsu |
| 7,499,307 | B2 | 3/2009 | Leung |
| 8,519,462 | B2 | 8/2013 | Wang et al. |
| 9,614,080 | B2 | 4/2017 | Widjaja |
| 2013/0271938 | A1 | 10/2013 | Lindert et al. |
| 2015/0069482 | A1 | 3/2015 | Mueller et al. |
| 2016/0300612 | A1 | 10/2016 | Manipatruni et al. |
| 2016/0307906 | A1* | 10/2016 | Kim ...................... H01L 27/088 |

OTHER PUBLICATIONS

Integrated Circuit Engineering Basic Technology, Chapter 11 Embedded Memory, Boston Technical Publ., Incorporated, 1966.

* cited by examiner

*Primary Examiner* — Hoai V Pham
(74) *Attorney, Agent, or Firm* — Amerson Law Firm, PLLC

(57) ABSTRACT

One illustrative DRAM structure disclosed herein includes a first memory cell pair, a second memory cell pair, a single diffusion break (SDB) isolation structure positioned between the first and second memory cell pairs, and a single first gate positioned between the first and second memory cell pairs and above the SDB isolation structure.

19 Claims, 4 Drawing Sheets

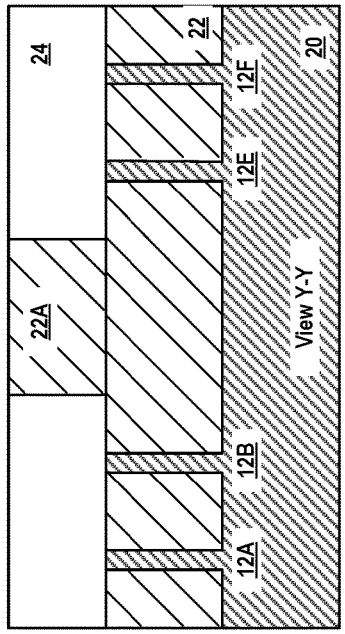
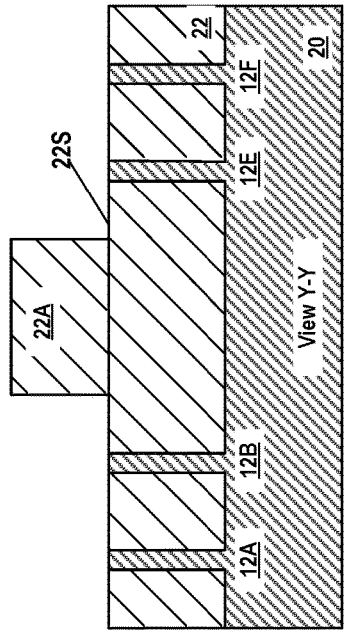
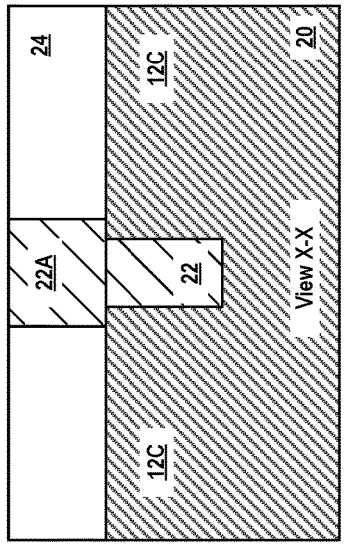
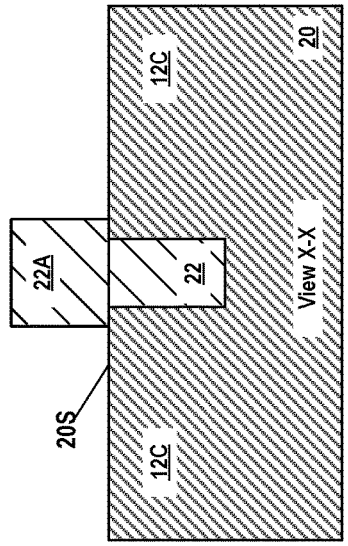
Fig. 4
Fig. 5

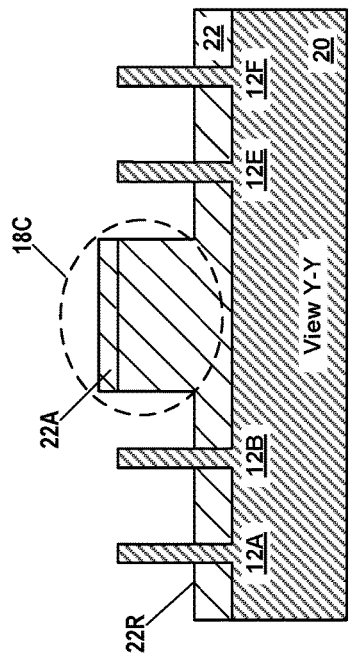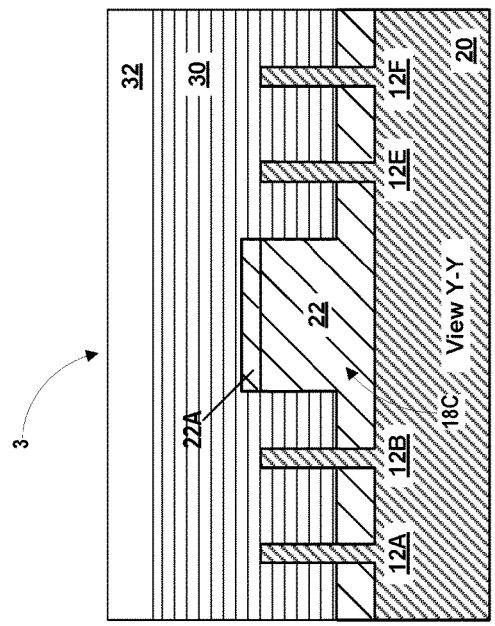
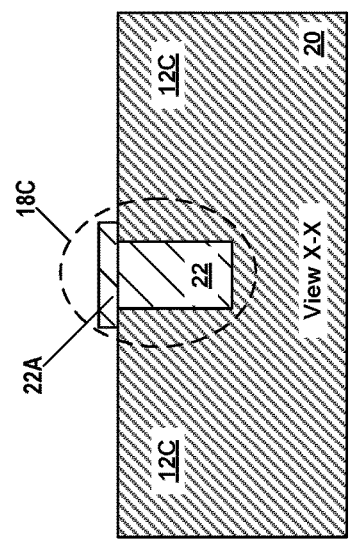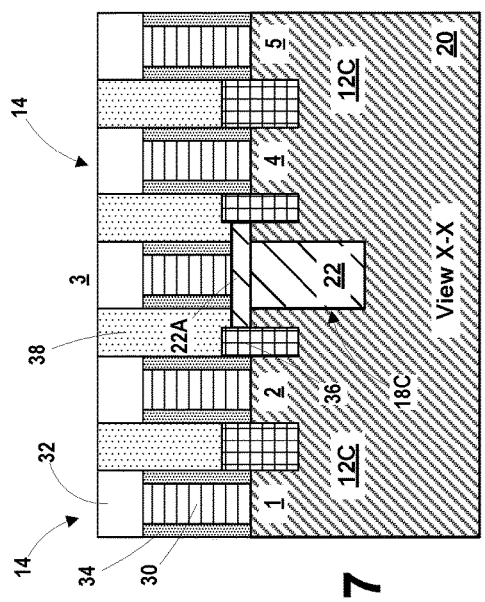
Fig. 6
Fig. 7

DRAM STRUCTURE WITH A SINGLE DIFFUSION BREAK

BACKGROUND OF THE INVENTION

1. Field of the Invention

The present disclosure generally relates to the fabrication of semiconductor devices, and, more particularly, to a novel DRAM (Dynamic Random Access Memory) structure with a single diffusion break ("SDB") isolation structure.

2. Description of the Related Art

Semiconductor memory devices are in widespread use in many modern integrated circuit devices and in many consumer products. In general, memory devices are the means by which electrical information is stored. There are many types of memory devices, SRAMs (Static Random Access Memory), DRAMs (Dynamic Random Access Memory), ROMs (Read Only Memory), etc., each of which has its own advantages and disadvantages relative to other types of memory devices. Millions of such memory devices are typically included in even very basic electronic consumer products. In typical operations, a relatively high electrical charge (HIGH) is stored in the memory device to represent a digital "1", while the absence of such an electrical charge or a relatively low charge (LOW) stored in the device indicates a digital "0". Read/write circuitry is used to access the memory device to store digital information on such a memory device and to determine whether or not a charge is presently stored in the memory device. These read/write cycles typically occur millions of times for a single memory device over its effective lifetime.

One illustrative prior art DRAM device generally comprises a plurality of individual memory cells. Each of the memory cells comprises a single transistor and a single capacitor—a 1T-1C DRAM. In such a prior art DRAM device, one of the source/drain regions of each transistor is coupled to the capacitor for that particular memory cell. The other source/drain region of the transistor in adjacent memory cells share a common source/drain region that is conductively coupled to a bit line. The gate structures of the transistors function as word lines in such a DRAM device. In such a prior art device, all of the capacitors within the device are separated by two gate structures. This arrangement leads to an excess consumption of valuable plot space on an integrated circuit product.

The present disclosure is directed to a novel DRAM structure with a single diffusion break ("SDB") isolation structure and methods of making such a DRAM structure that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a novel DRAM structure with a single diffusion break ("SDB") isolation structure and methods of making such a DRAM structure. One illustrative DRAM structure disclosed herein includes a first memory cell pair, a second memory cell pair, a single diffusion break (SDB) isolation structure positioned between the first and second memory cell pairs and a single first gate positioned between the first and second memory cell pairs and above the SDB isolation structure.

Another illustrative DRAM structure disclosed herein includes a first memory cell pair, a second memory cell pair positioned laterally adjacent the first memory cell pair, a third memory cell pair and a fourth memory cell pair positioned laterally adjacent the third memory cell pair. In this example, the DRAM structure further includes a single diffusion break (SDB) isolation structure positioned between the first and second memory cell pairs and between the third and fourth memory cell pairs, wherein the SDB isolation structure comprises a lower portion positioned in a trench formed in a semiconductor substrate and an upper portion positioned above an upper surface of the semiconductor substrate, wherein a bottom surface of the upper portion of the SDB isolation structure is positioned on and in contact with an upper surface of the semiconductor substrate and a single first gate positioned above the SDB isolation structure and between the first and second memory cell pairs and between the third and fourth memory cell pairs.

BRIEF DESCRIPTION OF THE DRAWINGS

The disclosure may be understood by reference to the following description taken in conjunction with the accompanying drawings, in which like reference numerals identify like elements, and in which:

FIGS. 1-7 are drawings that depict illustrative embodiments of various novel DRAM structures disclosed herein with a single diffusion break ("SDB") isolation structure and methods of making such DRAM structures.

Figure 1:
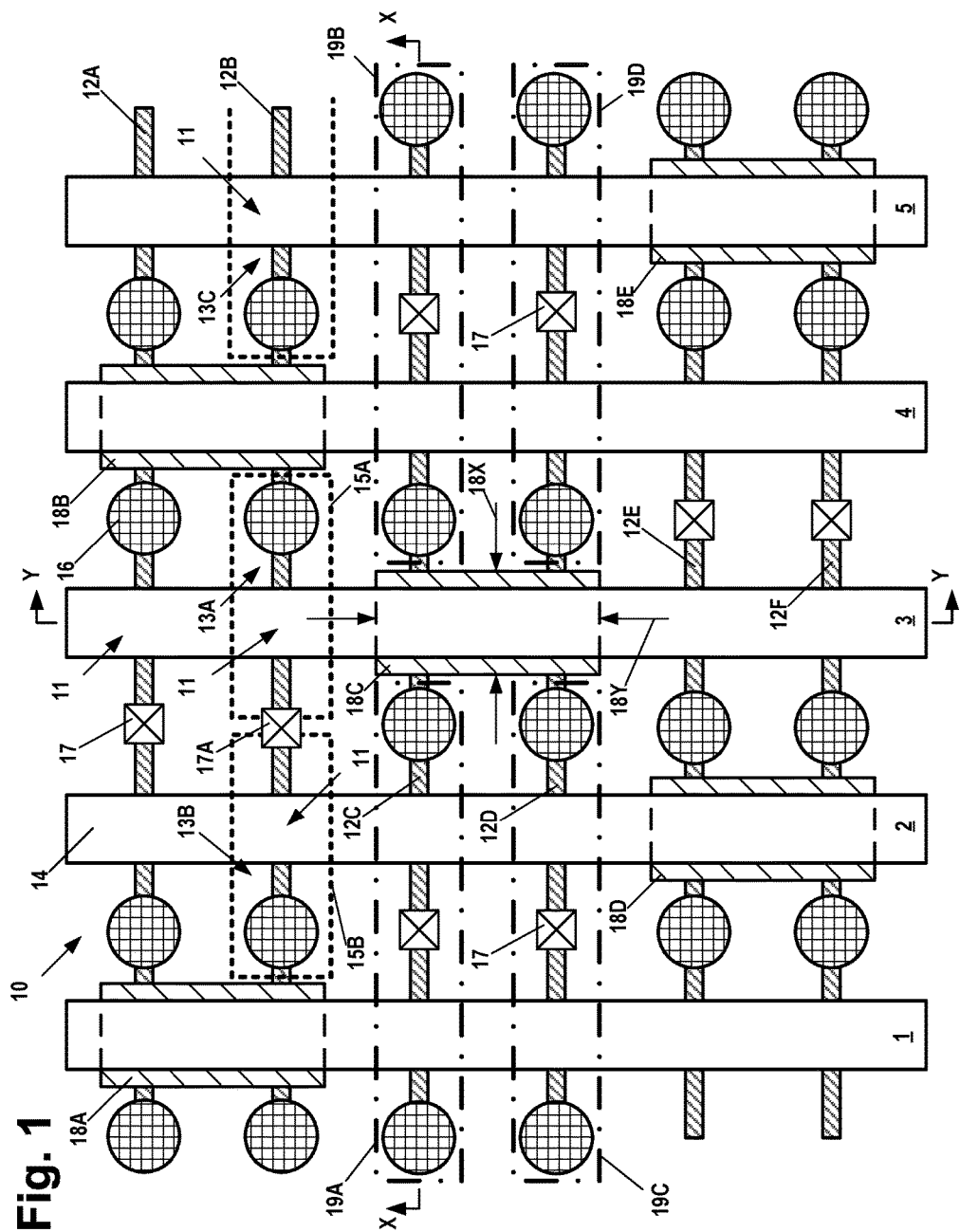

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The methods and devices disclosed herein may be employed in manufacturing IC products using a variety of technologies, e.g., NMOS, PMOS, CMOS, etc., and they may be employed in manufacturing a variety of different products that include DRAM memory sections. As will be appreciated by those skilled in the art after a complete reading of the present application, the gate structures of the transistor devices may be formed using either "gate first" or "replacement gate" manufacturing techniques. Of course, the inventions disclosed herein should not be considered to be limited to the illustrative examples depicted and described herein. With reference to the attached figures, various illustrative embodiments of the methods and devices disclosed herein will now be described in more detail.

FIGS. 1-7 depict various embodiment of a novel DRAM structure 10 comprising a plurality of single diffusion break ("SDB") isolation structures 18. In one illustrative example, the DRAM structure 10 may be an embedded DRAM structure, wherein the DRAM structure 10 is integrated on the same die or multi-chip module of an ASIC or a microprocessor. In the particular example depicted herein, the DRAM structure 10 comprises a plurality of FinFET transistor devices. However, after a complete reading of the present application, those skilled in the art will appreciate that the DRAM structure 10 disclosed herein may be fabricated with other types of transistor devices, e.g., planar transistor devices. Thus, the novel DRAM structure 10 disclosed herein should not be considered to be limited to being manufactured with any particular form of transistor devices.

FIG. 1 is a simplistic plan view of a portion of one illustrative embodiment of a novel DRAM structure 10 disclosed herein. In the illustrative example depicted herein, the DRAM structure 10 generally comprises a plurality of transistors 11, a plurality of fins 12A-12F (generally referenced using the numeral 12), a plurality of gates 14 (numbered 1-5 for reference purposes and generally referenced using the numeral 14), a plurality of capacitors 16 and a plurality of single diffusion break (SDB) isolation structures 18A-E (generally referenced using the numeral 18). Each of the gates 14 includes a conductive gate electrode (not shown in FIG. 1). Each transistor 11 comprises first and second source/drain regions located on opposite sides of the gate 14 of the transistor 11. A plurality of the SDB isolation structures 18 are positioned under each of the gates 14, wherein these SDB isolation structures 18 are physically separate isolation structures that are spaced apart from one another in a direction corresponding to the axial length of the gates 14 (in the gate width direction of the transistor devices 11).

The DRAM structure 10 comprises a plurality of individual memory cells that are generally referenced using the numeral 13. FIG. 1 depicts two such memory cells 13A, 13B within the dashed-line regions 15A and 15B. As depicted, each of the memory cells 13 comprises one transistor 11 and one capacitor 16, i.e., a 1T-1C DRAM unit cell. In each of the memory cells 13, the capacitor 16 is coupled to one of the source/drain regions of the transistor 11 and to ground. In the example depicted herein, the capacitors 16 may be stacked capacitor structures that are formed in one or more of the metallization layers (not shown) that are formed above the transistors 11. In other applications, the capacitors 16 may be trench-type isolation structures that are formed in a semiconductor substrate.

The transistor 11 for the unit memory cell 13A comprises gate number 3, while the transistor 11 for the unit memory cell 13B comprises gate number 2. As depicted, the transistors in the unit memory cells 13A and 13B share a source/drain region that is conductively coupled to a bit line (not shown) via the illustrative and simplistically depicted contact 17. Considered collectively, the memory cells 13A and 13B constitute a memory cell pair that comprises two laterally adjacent memory cells 13 that share a source/drain region that is conductively coupled to a bit line. Four illustrative memory cell pairs 19A, 19B, 19C and 19D (generally referenced using the numeral 19) are depicted within dashed line regions shown in FIG. 1. This pattern of laterally spaced apart memory cell pairs 19, such as the memory cell pairs 19A and 19B with a single SDB isolation structure 18 and a single gate (e.g., gate 3) positioned between the laterally spaced-apart memory cell pairs 19A and 19B is repeated throughout the DRAM structure 10. For example, the SDB isolation structure 18C is positioned between the memory cell pair 19A and the memory cell pair 19B. Also note that, within a particular memory cell pair 19, e.g., within the memory cell pair 19A, two illustrative gates (i.e., gates 1 and 2) are positioned between the capacitors 16 within that particular memory cell pair 19A. Similarly, two illustrative gates (e.g., gates 4 and 5) are laterally positioned between the two laterally spaced-apart capacitors 16 in the memory cell 19B.

Even more specifically, in the depicted example, the DRAM structure 10 comprises a first memory cell pair 19A, a second memory cell pair 19B positioned laterally adjacent the first memory cell pair 19A, a third memory cell pair 19C and a fourth memory cell pair 19D positioned laterally adjacent the third memory cell pair 19D. In this example, the DRAM structure 10 further includes a SDB isolation structure (e.g., 18C) and a single gate (e.g., gate 3) positioned above the SDB isolation structure between the first 19A and second 19B memory cell pairs and between the third 19C and fourth 19D memory cell pairs. This pattern is repeated throughout the DRAM structure 10.

The DRAM structure 10 also comprises a plurality of bit lines (not shown) and word lines (the gates 14) that allow individual access to each of the memory cells 13 so as to store a charge or deplete the charge on the capacitor 16 in each memory cell. In the DRAM structure 10 depicted herein, the gate electrodes of the gates 14 function as word lines. The bit lines for the DRAM structure 10 are formed in various conductive metallization layers (not shown) formed above the transistors 11 in the DRAM structure 10. As noted above, in the depicted example, a first of the source/drain regions of the transistor 11 in each memory cell 13 is conductively coupled to a capacitor 16 of that particular memory cell 13, and the capacitor 16 is coupled to ground. In the depicted example, a second source/drain region of each of the transistors 11 laterally adjacent memory cells 13 (e.g., the memory cells 13A and 13B)—a memory cell pair 19—are both commonly coupled to a particular bit line via illustrative contacts 17. For example, with reference to FIG. 1, the second source/drain regions on the transistors 11 of the memory cells 13A, 13B located between gates 2 and 3 (i.e., the source/drain regions of the transistor that is not coupled to the capacitor 16) may be commonly contacted by a bit line (not shown) at the schematically depicted reference contact point 17A.

As it relates to the general functionality of the DRAM structure 10, the presence of a relatively higher electrical charge on the capacitor 16 of each memory cell 13 is representative of a logically "high" value (e.g., a "1"), while the presence of a relatively lower electrical charge on the capacitor 16 is representative of a logically "low" value (e.g., a "0"). Traditional read/write circuitry (not shown) may be operatively coupled to the DRAM structure 10 to determine the status of the charge on the capacitor 16 in each memory cell 13 when a particular memory cell 13 in the DRAM structure 10 is accessed via the bit lines and word lines.

With continuing reference to FIG. 1, the (SDB) isolation structures 18 may be of any desired size, and they may have any desired configuration (when viewed from above). In the particular example depicted herein, the (SDB) isolation structures 18 have a generally rectangular configuration (when viewed from above). With reference to the SDB isolation structure 18C, the SDB isolation structures 18 may have a first dimension 18X (in the current transport (or gate length) direction of the transistor devices 11 and a second dimension 18Y (in the gate width direction of the transistor devices). The dimensions 18X and 18Y may vary depending upon the particular application.

Formation of the (SDB) isolation structures 18 on the novel DRAM structure 10 disclosed herein provides significant scaling (i.e., size reduction) advantages as it relates to prior art DRAM structures. For example, by use of the novel (SDB) isolation structures 18 disclosed herein, the lateral spacing between capacitors 16 on laterally adjacent memory cell pairs 19 in the DRAM structure 10 may be reduced as compared to prior art DRAM structures. That is, the lateral spacing between the capacitors 16 (in memory cell pairs 19A and 19B) on opposite sides of the SDB isolation structure 18C is less than the spacing between such capacitors 16 on prior art DRAM structures. More specifically, in the novel DRAM structure 10 disclosed herein, only a single gate 14, i.e., gate number 3, is positioned between the capacitor 16 in the memory cell pair 19A nearest gate 3 and the capacitor 16 in the memory cell pair 19B nearest gate 3. This is in stark contrast to at least some prior art DRAM structures wherein at least two such gate structures 14 are positioned between corresponding capacitors 16 on adjacent memory cell pairs. Also note that, within a particular memory cell pair 19, two gates 14 are positioned between the two capacitors 16 within that particular memory cell pair 19. For example, with reference to FIG. 1, the gates 1 and 2 are positioned between the two capacitors 16 within the memory cell pair 19A, while the gates 4 and 5 are positioned between the two capacitors 16 within the memory cell pair 19B. It should be understood that, when it is stated herein that certain structures are positioned "between" or "near" another structure (or other relative positional terms), the reference is made to the layout of the structure or the projection of those structures on a common plane. This is the understanding that should be given to such words in this specification and in the attached claims. For example, in one example, the gates 14 are formed approximately at the level of the upper surface of a semiconductor substrate, while the capacitors 16 may (in one embodiment) be formed in one or more metallization layers formed above that are positioned well above the upper surface of the substrate. Thus, the gates 14 are not positioned physically between the capacitors 16 since these structures are located at physically different levels within an IC product. Nevertheless, from a layout perspective, i.e., a plan view, certain of the gates 14 may be understood to be positioned between certain of the capacitors 16. For example, gates 1 and 2 are positioned between the capacitors within each of the memory cell pairs 19A and 19C. Similarly, the single gate 3 is positioned between the nearest capacitor 16 of the memory cell pair 19A (on one side of the gate 3) and the nearest capacitor 16 of the memory cell pair 19B (on the opposite side of the gate 3).

FIGS. 2-7 are cross-sectional views ("X-X" and "Y-Y") that depict one illustrative process flow that may be performed to form at least one embodiment of a novel DRAM structure 10 disclosed herein. The cross-sectional view X-X is taken through the fin 12C and across the gates 14 in a gate-length direction of the transistor devices 11, i.e., the view X-X is taken through the long axis of the fin 12C. The cross-sectional view Y-Y is taken through gate number 3 and across the fins 12 in a gate-width direction of the transistor devices 11.

Figure 2:
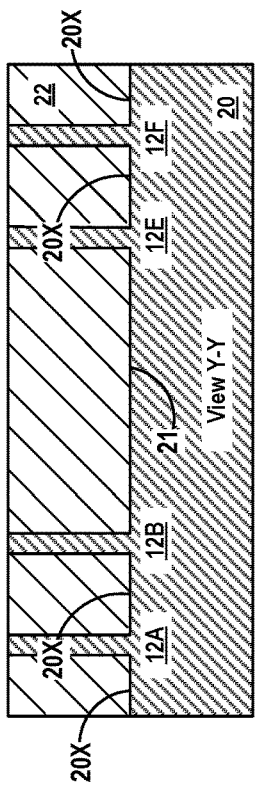

FIG. 2 depicts the DRAM structure 10 after several processing operations were performed. First, the fins 12 were formed in the substrate 20 using traditional manufacturing techniques. More specifically, a patterned fin-formation etch mask (not shown), e.g., silicon nitride/silicon dioxide, was formed above the substrate 20. The fin-formation etch mask comprises openings corresponding to locations where fin-formation trenches 20X will be formed in the substrate to define the fins 12. In one illustrative embodiment, the fin-formation etch mask may also comprise openings that correspond to locations where SDB trenches 21 will effectively be cut into the fins 12. As shown more fully below, the SDB trenches 21 will be filled with an insulating material to define at least a portion of the SDB isolation structures 18. Thereafter, one or more etching processes were performed through the patterned fin-formation etch mask to form the plurality of fin-formation trenches 20X in the substrate 20 and the SDB trenches 21 in the fins 12. For example, the view X-X in FIG. 2 depicts the formation of the trench 21 in the fin 12C that effectively results in the formation of the fin 12C into two different spaced apart sections on opposite sides of the trench 21, by removing substrate material under the area exposed by the openings in the fin-formation etch mask that correspond to the SDB trenches 21. The view Y-Y in FIG. 2 shows that the trench 21 was formed so as to effectively remove portions of the substrate material 20 that would have otherwise been formed as portions of the fins 12C and 12D. At that point, a layer of insulating material 22 (e.g., silicon dioxide) was blanket-deposited across the substrate 20 so as to overfill the fin-formation trenches 20X and the SDB trenches 21. Thereafter, a CMP process was performed to planarize the layer of insulating material 22 using the upper surface of the fins 12 as a polish-stop layer. This process operation effectively removes the patterned fin-formation hard mask. With reference to FIG. 1, the formation of the SDB trenches 21 for the SDB isolation structure 18A effectively cuts or prevents the formation of the fins 12A-12B (at a first location). Similarly, the formation of the trenches 21 for the SDB isolations structures 18B, 18C, 18D and 18E effectively cuts or prevents the formation of the fins 12A-B (at a second location); the fins 12C-D; the fins 12E-F (at a first location) and the fins 12E-F (at a second location), respectively. Alternatively, in lieu of forming the openings for the SDB trenches in the fin formation etch mask, the fins 12 may be uniformly formed in the substrate 20 by the formation of the trenches 20X. Thereafter, the fin-formation etch mask may be removed and another masking layer (a "cut" mask) having openings corresponding to the location of the SDB trenches 21 may be formed across the substrate. Then, an etching process may be performed through this cut mask to form the SDB trenches 21 in the previously formed fins 12.

The substrate 20 may have a variety of configurations, such as the depicted bulk silicon configuration. The substrate 20 may also have a silicon-on-insulator (SOI) configuration that includes a bulk silicon layer, a buried insulation layer and an active layer, wherein semiconductor devices are formed in and above the active layer. The substrate 20 may be made of silicon or it may be made of materials other than silicon. Thus, the terms "substrate" or "semiconductor substrate" should be understood to cover all semiconducting materials and all forms of such materials. Additionally, various doped regions, e.g., halo implant regions, well regions and the like, are not depicted in the attached drawings.

Figure 3:
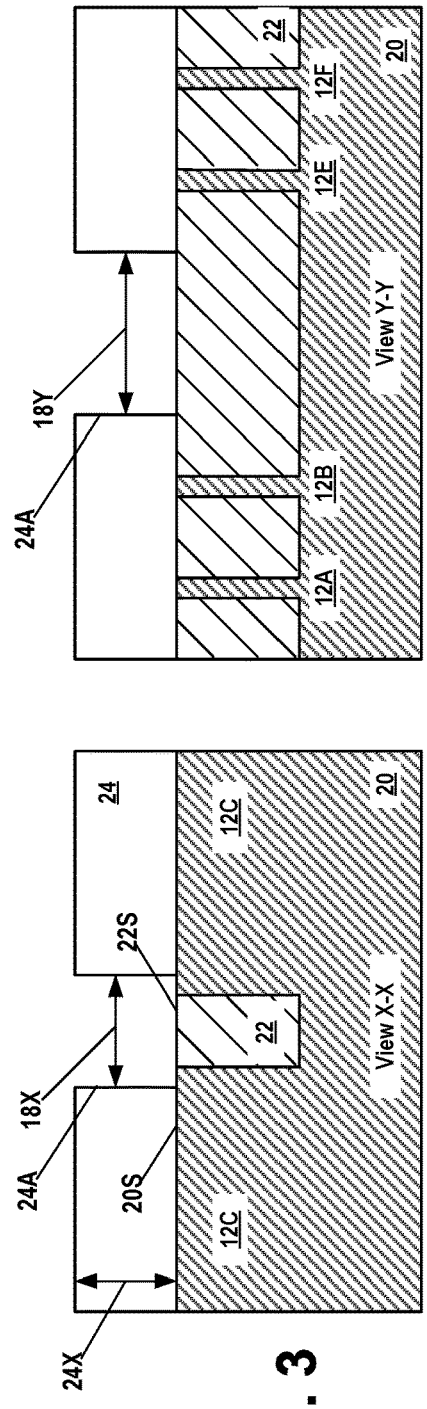

FIG. 3 depicts the DRAM structure 10 after a patterned layer of material 24 was formed above the upper surface 20S of the substrate 20 and above the upper surface 22S of the insulating material 22. The patterned layer of material 24 comprises a plurality of openings 24A (only one of which is shown in FIG. 3), wherein each of the openings 24A have dimensions that correspond approximately to the dimensions 18X and 18Y of the (SDB) isolation structures 18, i.e., the "footprint" of the upper portions of the (SDB) isolation structures 18 that is located above the upper surface 20S of the substrate 20 and above the upper surface 22S of the insulating material 22. The patterned layer of material 24 may be formed by blanket-depositing a layer of the material 24 above the substrate 20 and thereafter performing an etching process through a patterned etch mask (e.g., photoresist) (not shown) that was formed above the deposited layer of material 24. FIG. 3 depicts the DRAM structure 10 after the patterned etch mask was removed. The patterned layer of material 24 may be comprised of a variety of different material, e.g., silicon nitride, etc. The patterned layer of material 24 should be made of a material that may be selectively etched relative to the insulating material 22 and the substrate 20. The vertical thickness 24X of the patterned layer of material 24 may vary depending upon the particular application. In one illustrative embodiment, the thickness 24X should be greater than the vertical amount of the material 22 that will be removed to "reveal" the final desired exposed height of the fins 12, as described more fully below.

FIG. 4 depicts the DRAM structure 10 after several processing operations were performed. First, a layer of insulating material 22A (e.g., silicon dioxide) was blanket-deposited across the patterned layer of material 24 so as to overfill the openings 24A. Thereafter a CMP process was performed to planarize the layer of insulating material 22A using the upper surface of the patterned layer of material 24 as a polish-stop layer. In one illustrative embodiment, the layer of insulating material 22A may be comprised of the same material as that of the layer of insulating material 22, although that situation may not be required in all applications.

FIG. 5 depicts the DRAM structure 10 after the patterned layer of material 24 was selectively removed relative to the surrounding materials. This leaves blocks of the insulating material 22A positioned above the upper surface 20S of the substrate 20 and above the upper surface 22S of the insulating material 22. The blocks of material 22A have dimensions (when viewed from above) that correspond to the dimensions 18X and 18Y of the SDB isolation structures 18.

FIG. 6 depicts the DRAM structure 10 after a timed, anisotropic recess etching process was performed to remove portions of the insulating material 22A and portions of the insulating material 22. This recess etching process exposes or "reveals" the final desired height of the fins 12 above the recessed upper surface 22R of the layer of insulating material 22. As depicted, the combination of the insulating materials 22A and 22 constitute the (SDB) isolation structure 18C disclosed herein, with the material 22A constituting an upper portion of the (SDB) isolation structure 18C and the material 22 constituting a lower portion of the (SDB) isolation structure 18C. The other (SDB) isolation structures 18 have the same configuration as that of the (SDB) isolation structure 18C After the processing in FIG. 6 was completed, several additional process operations were performed on the DRAM structure 10, as shown in FIG. 7. First, the gates 14 (numbered 1-5) were formed above the fins 12. Each of the gates 14 includes a schematically depicted final gate structure 30, a gate cap 32 and a sidewall spacer 34. In the illustrative example depicted herein, the gate structures 30 may be manufactured using well-known replacement gate manufacturing techniques or gate-first manufacturing techniques. The sidewall spacers 34 and the gate caps 32 may be comprised of a variety of different materials, such as silicon nitride, SiNC, SiN, SiCO, SiNOC, etc., and they may be made of the same or different materials. Still referencing FIG. 7, epi semiconductor material 36 was formed on the exposed portions of the fins 12, i.e., in the source/drain regions of the transistor devices 11 by performing an epitaxial growth process. The epi material 36 may be formed to any desired thickness. However, it should be understood that the epi material 36 need not be formed in all applications. Other layers of material, such as contact etch stop layers and the like, are not depicted in the drawing. Also depicted are illustrative source/drain contact structures 38, which typically include a so-called "trench silicide" (TS) structure (not separately shown). As indicated, the upper surface of the source/drain contact structures 38 is typically approximately level with the upper surface of the gate caps 32. As depicted in FIG. 7 and FIG. 1, a portion of the axial length (in the gate width direction of the transistors 11) of the gate structure 30 for gate 3 is positioned above the (SDB) isolation structure 18C. The other gates 14 and the other SDB isolation structures 18 have a similar relationship. At this point in the process, various metallization layers (not shown) may be formed above the DRAM structure 10.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A DRAM structure, comprising:
   a first memory cell pair;
   a second memory cell pair;
   a single diffusion break (SDB) isolation structure positioned between said first memory cell pair and said second memory cell pair; and
   a single first gate positioned between said first memory cell pair and said second memory cell pair and above said SDB isolation structure.

2. The DRAM structure of claim 1, wherein said SDB isolation structure comprises a lower portion positioned in a trench formed in a semiconductor substrate and an upper portion positioned above an upper surface of said semiconductor substrate, wherein a bottom surface of said upper portion of said SDB isolation structure is positioned on and in contact with an upper surface of said semiconductor substrate.

3. The DRAM structure of claim 1, wherein said SDB isolation structure has a generally rectangular configuration when viewed from above.

4. The DRAM structure of claim 1, wherein said single first gate is positioned on and in contact with said SDB isolation structure.

5. The DRAM structure of claim 1, wherein each of said first memory cell pair and said second memory cell pair comprise first and second memory cells, and wherein each of said first and second memory cells comprise one transistor and one capacitor.

6. The DRAM structure of claim 1, wherein:
   said first memory cell pair comprises a first memory cell and a second memory cell, said first memory cell comprising a first transistor and a first capacitor, said second memory cell comprising a second transistor and a second capacitor, wherein second and third gates are positioned between said first and second capacitors; and
   said second memory cell pair comprises a third memory cell and a fourth memory cell, said third memory cell comprising a third transistor and a third capacitor, said fourth memory cell comprising a fourth transistor and a fourth capacitor, wherein fourth and fifth gate structures are positioned between said third and fourth capacitors.

7. The DRAM structure of claim 6, wherein said first transistor and said second transistors share a first source/drain region that is adapted to be coupled to a first bit line and said third and fourth transistors share a second source/drain region that is adapted to be coupled to a second bit line.

8. The DRAM structure of claim 6, wherein said SDB isolation structure is positioned between said first capacitor within said first memory cell pair and said second capacitor within said second memory cell pair.

9. The DRAM structure of claim 1, wherein said SDB isolation structure has a dimension in a direction corresponding to a gate length direction of a transistor in said first memory cell pair that is greater than a dimension of said single first gate in said direction corresponding to said gate length direction of said transistor in said first memory cell pair.

10. The DRAM structure of claim 1, further comprising:
    a third memory cell pair; and
    a fourth memory cell pair, wherein said SDB isolation structure is positioned between said third memory cell pair and said fourth memory cell pair and wherein said single first gate is positioned between said third memory cell pair and said fourth memory cell pair and above said SDB isolation structure.

11. The DRAM structure of claim 1, further comprising a second SDB isolation structure positioned under said single first gate structure, said second SDB isolation structure being spaced apart from and separate from said SDB isolation structure.

12. The DRAM structure of claim 1, wherein said SDB isolation structure comprises silicon dioxide.

13. A DRAM structure, comprising:
    a first memory cell pair;
    a second memory cell pair positioned laterally adjacent said first memory cell pair;
    a third memory cell pair;
    a fourth memory cell pair positioned laterally adjacent said third memory cell pair;
    a single diffusion break (SDB) isolation structure positioned between said first memory cell pair and said second memory cell pair and between said third memory cell pair and said fourth memory cell pair, wherein said SDB isolation structure comprises a lower portion positioned in a trench formed in a semiconductor substrate and an upper portion positioned above an upper surface of said semiconductor substrate, wherein a bottom surface of said upper portion of said SDB isolation structure is positioned on and in contact with said upper surface of said semiconductor substrate; and
    a single first gate positioned above said SDB isolation structure and between said first memory cell pair and said second memory cell pair and between said third memory cell pair and said fourth memory cell pair.

14. The DRAM structure of claim 13, wherein each of said first, second, third and fourth memory cell pairs comprise first and second memory cells, and wherein each of said first and second memory cells comprise one transistor and one capacitor.

15. The DRAM structure of claim 13, wherein:
    said first memory cell pair comprises a first memory cell and a second memory cell, said first memory cell comprising a first transistor and a first capacitor, said second memory cell comprising a second transistor and a second capacitor, wherein second and third gates are positioned between said first and second capacitors; and
    said second memory cell pair comprises a third memory cell and a fourth memory cell, said third memory cell comprising a third transistor and a third capacitor, said fourth memory cell comprising a fourth transistor and a fourth capacitor, wherein fourth and fifth gate structures are positioned between said third and fourth capacitors.

16. The DRAM structure of claim 15, wherein said first transistor and said second transistor share a first source/drain region that is adapted to be coupled to a first bit line and said third transistor and said fourth transistor share a second source/drain region that is adapted to be coupled to a second bit line.

17. The DRAM structure of claim 16, wherein said SDB isolation structure is positioned between said first capacitor within said first memory cell pair and said second capacitor within said second memory cell pair.

18. The DRAM structure of claim 17, wherein said SDB isolation structure has a dimension in a direction corresponding to a gate length direction of said transistor in said first memory cell pair that is greater than a dimension of said single first gate in said direction corresponding to said gate length direction of said transistor in said first memory cell pair.

19. The DRAM structure of claim 15, further comprising a second SDB isolation structure positioned under said single first gate structure, said second SDB isolation structure being spaced apart from and separate from said SDB isolation structure.

* * * * *